United States Patent
Guo (10) Patent No.: US 10,295,612 B2
(45) Date of Patent: May 21, 2019

(54) ELECTRONIC DEVICE WITH RESISTIVE SENSOR ARRAY

(71) Applicant: Apple Inc., Cupertino, CA (US)

(72) Inventor: Jian Guo, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 67 days.

(21) Appl. No.: 15/332,119

(22) Filed: Oct. 24, 2016

(65) Prior Publication Data

US 2017/0285082 A1    Oct. 5, 2017

Related U.S. Application Data (60) Provisional application No. 62/318,546, filed on Apr. 5, 2016.

(51) Int. Cl.
*G01R 27/02*    (2006.01)
*G01D 5/165*    (2006.01)
(Continued)

(52) U.S. Cl.
CPC ......... *G01R 33/0023* (2013.01); *G01D 5/165* (2013.01); *G01R 27/14* (2013.01); *G01R 33/09* (2013.01); *G01R 33/0094* (2013.01)

(58) Field of Classification Search
CPC .......... G01D 5/16; G01R 27/02; G01R 27/08; G01R 27/14
(Continued)

(56) References Cited

U.S. PATENT DOCUMENTS 4,725,816 A * 2/1988 Petterson ............... H03M 11/24
341/24
6,341,084 B2 * 1/2002 Numata .................. G11C 11/15
365/158
(Continued)

FOREIGN PATENT DOCUMENTS

WO    1998006058    2/1998

OTHER PUBLICATIONS

Guo, Bin, et al. "A monolithic integrated 4×4 tin oxide gas sensor array with on-chip multiplexing and differential readout circuits." solid-state electronics 51.1 (2007): 69-76. (Year: 2007).*
(Continued)

*Primary Examiner* — Christopher P McAndrew
(74) *Attorney, Agent, or Firm* — Treyz Law Group, P.C.; George Victor Treyz; Jason Tsai (57) ABSTRACT

An array of resistive sensor circuits may be used to gather sensor data. Each resistive sensor circuit may have a resistive sensor and an associated switch. Row decoder circuitry may supply rows of the sensor circuits with control signals on row lines. Capacitors associated with respective columns of the array may be provided with an initialization voltage. The control signals on the row lines may be used to turn on the switches in a selected row of the resistive sensor circuits and thereby discharge the capacitors through the resistive sensors of that row. Comparators may have first inputs coupled to the capacitors and second inputs that receive a reference voltage. A column readout circuit may have memory and processing circuitry that receives count values from a counter and that stores the count values in response to toggling output signals from the comparators.

19 Claims, 7 Drawing Sheets

(51) Int. Cl.
  *G01R 27/14* (2006.01)
  *G01R 33/00* (2006.01)
  *G01R 33/09* (2006.01)
(58) Field of Classification Search
  USPC .......................................................... 324/691
  See application file for complete search history.

(56) References Cited

U.S. PATENT DOCUMENTS

| | | | |
|---|---|---|---|
| 6,585,660 B2 | 7/2003 | Dorando et al. | |
| 6,822,640 B2* | 11/2004 | Derocher | G06F 3/04886 178/18.11 |
| 6,954,392 B2* | 10/2005 | Baker | G11C 7/06 365/158 |
| 7,034,677 B2* | 4/2006 | Steinthal | B82Y 30/00 128/903 |
| 7,171,312 B2* | 1/2007 | Steinthal | B82Y 30/00 702/32 |
| 8,348,503 B2 | 1/2013 | Brody et al. | |
| 8,351,993 B2 | 1/2013 | Nunes | |
| 8,416,213 B2* | 4/2013 | Shen | G06F 3/0414 178/18.05 |
| 9,400,582 B2* | 7/2016 | Bernstein | G06F 3/016 |
| 9,405,409 B1* | 8/2016 | Grivna | G06F 3/044 |
| 2001/0048608 A1* | 12/2001 | Numata | G11C 11/15 365/158 |
| 2003/0020594 A1* | 1/2003 | Nicholson | H01L 27/0802 338/320 |
| 2003/0043616 A1* | 3/2003 | Baker | G11C 7/062 365/148 |
| 2004/0027341 A1* | 2/2004 | Derocher | G06F 3/03547 345/173 |
| 2004/0190327 A1* | 9/2004 | Baker | G11C 7/062 365/148 |
| 2005/0018477 A1* | 1/2005 | Baker | G11C 7/06 365/158 |
| 2005/0254295 A1* | 11/2005 | Nazarian | G11C 11/16 365/173 |
| 2008/0121045 A1* | 5/2008 | Cole | G01N 27/226 73/861.08 |
| 2009/0284398 A1* | 11/2009 | Shen | G06F 3/0414 341/33 |
| 2011/0141052 A1* | 6/2011 | Bernstein | G06F 3/016 345/174 |
| 2012/0127124 A1* | 5/2012 | Zanone | G06F 1/3231 345/174 |
| 2015/0073741 A1 | 3/2015 | Wüst et al. | |

OTHER PUBLICATIONS

Joo, Segyeong, and Richard B. Brown. "Chemical sensors with integrated electronics." Chemical reviews 108.2 (2008): 638-651. (Year: 2008).*

* cited by examiner

ELECTRONIC DEVICE WITH RESISTIVE SENSOR ARRAY

This application claims the benefit of provisional patent application No. 62/318,546, filed Apr. 5, 2016, which is hereby incorporated herein in its entirety.

FIELD

This relates generally to electronic devices and, more particularly, to electronic devices with sensors.

BACKGROUND

Electronic devices sometimes contain resistive sensors. Resistive sensors may be used, for example, to make magnetic measurements or chemical gas measurements. Sensors such as these have sensor elements that change resistance as a function of exposure to magnetic fields of varying strength or exposure to different concentrations of a gas in the atmosphere.

Conventional resistive sensor support circuitry is based on operational amplifier circuitry that converts resistance variations into voltage measurements for digitization by an analog-to-digital converter. This type of arrangement is generally only suitable for single-element resistive sensing applications.

SUMMARY

An electronic device may have input-output devices such as resistive sensors. An array of resistive sensor circuits may be used to gather sensor data. The array may have rows and columns of the resistive sensor circuits. Each resistive sensor circuit may have a resistive sensor and an associated switch.

Resistor sensor array control circuitry may be used to gather resistive sensor data from the array of resistive sensors. The resistor sensor array control circuitry may include row decoder circuitry coupled to row lines and column readout circuitry coupled to column lines. Each row of the array may have an associated one of the row lines and each column of the array may have an associated one of the column lines.

The row decoder circuitry may supply rows of the sensor circuits with control signals on the row lines. Capacitors may be provided with an initialization voltage. The control signals on the row lines may be used to turn on the switches in a selected row of the resistive sensor circuits and thereby discharge the capacitors through the resistive sensors of that row.

Comparators in the column readout circuitry may have first inputs coupled to the capacitors and second inputs that receive a reference voltage. The column readout circuit may have memory and processing circuitry that receives count values from a counter and that stores the count values in response to toggling output signals from the comparators.

DETAILED DESCRIPTION

Electronic devices may be provided with sensors. Sensors may be used to measure air pressure, gas composition, magnetic field strength, force, ultrasonic or non-ultrasonic acoustic signals, and/or other parameters. These sensors may have sensor elements that operate based on piezoelectric effects, strain gauge structures, semiconductor structures, microelectromechanical systems (MEMS) structures, sensor structures with interdigitated sets of conductive fingers, and/or other types of sensor elements. Illustrative configurations in which the sensors for the electronic devices exhibit changes in resistance (i.e., configurations in which the sensors are resistive sensors) may sometimes be described herein as an example.

Figure 1:
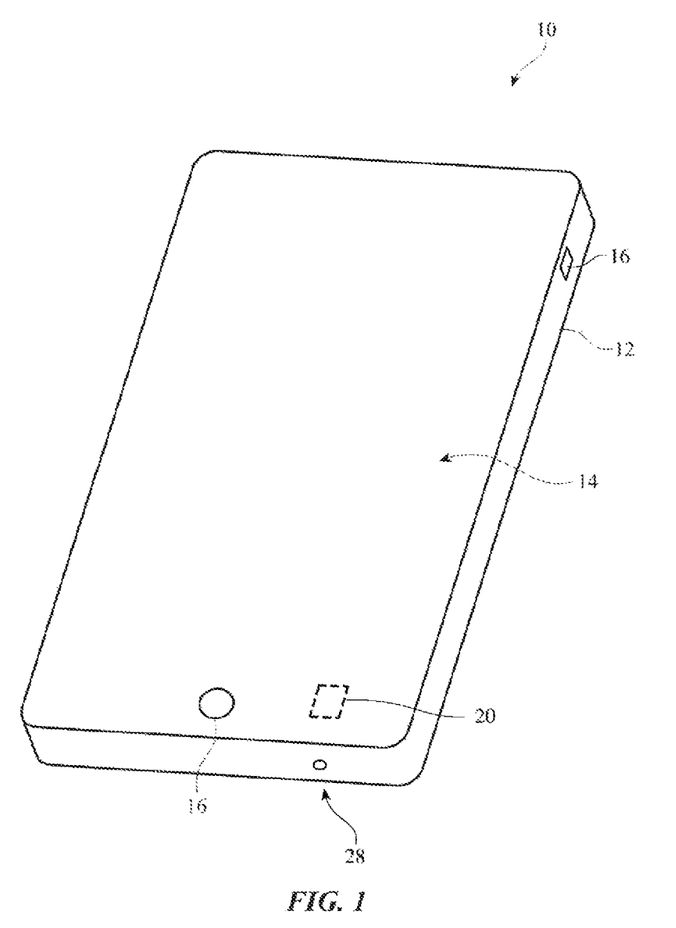
FIG. 1 is a perspective view of an illustrative electronic device in accordance with an embodiment.

FIG. 1 is a perspective view of an illustrative electronic device of the type that may include resistive sensors. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment. In the illustrative configuration of FIG. 1, device 10 is a portable device such as a cellular telephone, media player, tablet computer, wrist-watch device or other portable computing device. Other configurations may be used for device 10 if desired. The example of FIG. 1 is merely illustrative.

In the example of FIG. 1, device 10 includes display 14. Display 14 has been mounted in housing 12. Electronic device housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch sensor electrodes may be formed from an array of indium tin oxide pads, other transparent conductive structures, or other touch sensor electrode structures.

Display 14 may include an array of pixels formed from liquid crystal display (LCD) components, an array of electrophoretic pixels, an array of plasma display pixels, an array of organic light-emitting diode pixels or other light-emitting diode pixels, an array of electrowetting pixels, or pixels based on other display technologies.

Display 14 may be protected using a display cover layer such as a layer of transparent glass, clear plastic, transparent ceramic, sapphire or other transparent crystalline material, or other transparent layer(s). The display cover layer may have a planar shape, a convex curved profile, a concave curved profile, a shape with planar and curved portions, a layout that includes a planar main area surrounded on one or more edge portions that are bent out of the plane of the planar main area, or other suitable shape. An opening may be formed in the display cover layer to accommodate a speaker port. Openings may also be formed in the display cover layer and/or housing 12 to accommodate buttons 16.

Openings may also be formed in housing 12 to sensor ports such as sensor port 28. Resistive sensors such as resistive sensor 20 of FIG. 1 may be mounted within the interior of housing 12 in alignment with sensor port 28 and/or may be mounted elsewhere within device 10. In some configurations, resistive sensors make measurements on the ambient air surrounding device 10 (e.g., measurements on the chemical composition of the ambient air, humidity, temperature, pressure, etc.). In this type of arrangement, ambient air from the exterior of device 10 may communicate with sensor 20 through port 28. In other configurations, resistive sensors may be mounted on a printed circuit board or other substrate in the interior of device 10 and may make measurements through the wall of housing 12 or a window structure without using a sensor port opening (e.g., to make magnetic measurements, etc.).

Sensor arrays and other groups of multiple resistive sensors may be used to enhance sensor dynamic range and accuracy and may otherwise be used to enhance the ability of the sensors to make desired sensor measurements for device 10 (e.g., to cover additional types of sensor measurement, etc.). The resistive sensors in an array may be formed from a set of sensors that are integrated onto a common substrate (e.g., a common semiconductor die such as a common silicon substrate) or may be formed from discrete sensor substrates. Resistive sensor processing circuitry (e.g., resistive sensor array processing circuitry) may be incorporated on the same substrate as an array of sensors (as an example).

Figure 2:
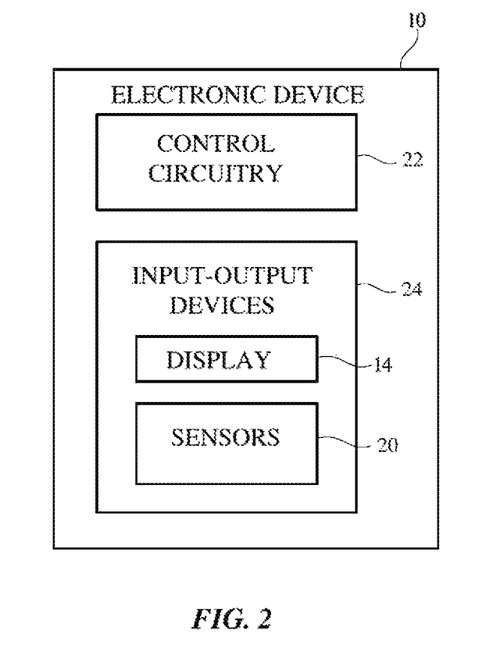
FIG. 2 is a schematic diagram of an illustrative electronic device with sensors in accordance with an embodiment.

FIG. 2 is a schematic diagram of an illustrative electronic device of the type that may be provided with resistive sensors. As shown in FIG. 2, electronic device 10 may have control circuitry 22. Control circuitry 22 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 22 may be used to control the operation of device 10. For example, the processing circuitry may display alerts, may display sensor measurement data, and may take other suitable actions in response to magnetic field measurements, temperature measurements, ambient air gas composition measurements, ambient air particulate measurements, ambient air relative humidity measurements, etc. The processing circuitry may be based on one or more microprocessors, microcontrollers, digital signal processors, baseband processors, power management units, audio chips, application specific integrated circuits, etc.

Input-output circuitry in device 10 such as input-output devices 24 may be used to allow data to be supplied to device 10 and to allow data to be provided from device 10 to external devices. Input-output devices 24 may include buttons such as buttons 16 and other buttons, joysticks, scrolling wheels, touch pads, key pads, keyboards, microphones, speakers, tone generators, vibrators or other components with moving parts, cameras, light-emitting diodes and other status indicators, data ports, etc. As shown in FIG. 2, input-output devices 24 may include sensors 20. Sensors 20 may include resistive sensors that make magnetic field measurements, chemical measurements (e.g., ambient air gas composition measurements), ambient air particulate measurements, ambient air relative humidity measurements, temperature measurements, pressure measurements, force (stress) measurements, ambient light measurements and other light measurements, acoustic measurements, touch input measurements, etc. A user can control the operation of device 10 by supplying commands through input-output devices 24 and may receive status information and other output from device 10 using the output resources of input-output devices 24. Input-output devices 24 may include one or more displays such as display 14.

Control circuitry 22 may be used to run software on device 10 such as operating system code and applications. During operation of device 10, the software running on control circuitry 22 may display images on display 14 using an array of pixels in display 14. The software running on control circuitry 22 may gather sensor data from sensors 20 and may display alerts and other information on display 14 based on gathered sensor measurements.

Figure 3:
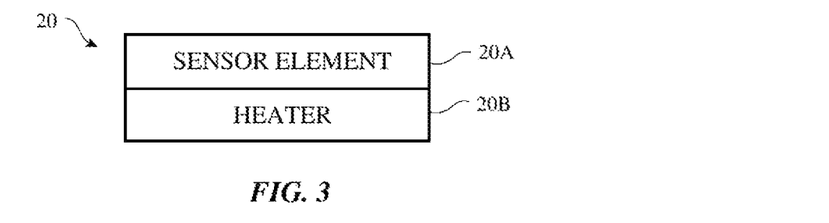
FIG. 3 is a cross-sectional side view of an illustrative resistive sensor in accordance with an embodiment.

A cross-sectional side view of an illustrative resistive sensor is shown in FIG. 3. As shown in FIG. 3, sensor 20 may include a sensor element such as sensor element 20A and an associated heating element such as optional heating element 20B. Heater element 20B may use ohmic heating, inductive heating, and/or other heating techniques adjust the temperature T of sensor element 20A. In some sensors, sensor resistivity changes that take place as a function of temperature can be used to help discriminate between different gases (i.e., to identify particular constituent gases such as ozone or carbon dioxide in ambient air). By monitoring the way in which the resistivity of sensor element 20A changes in response to changes in temperature T, accuracy may be enhanced.

Figure 4:
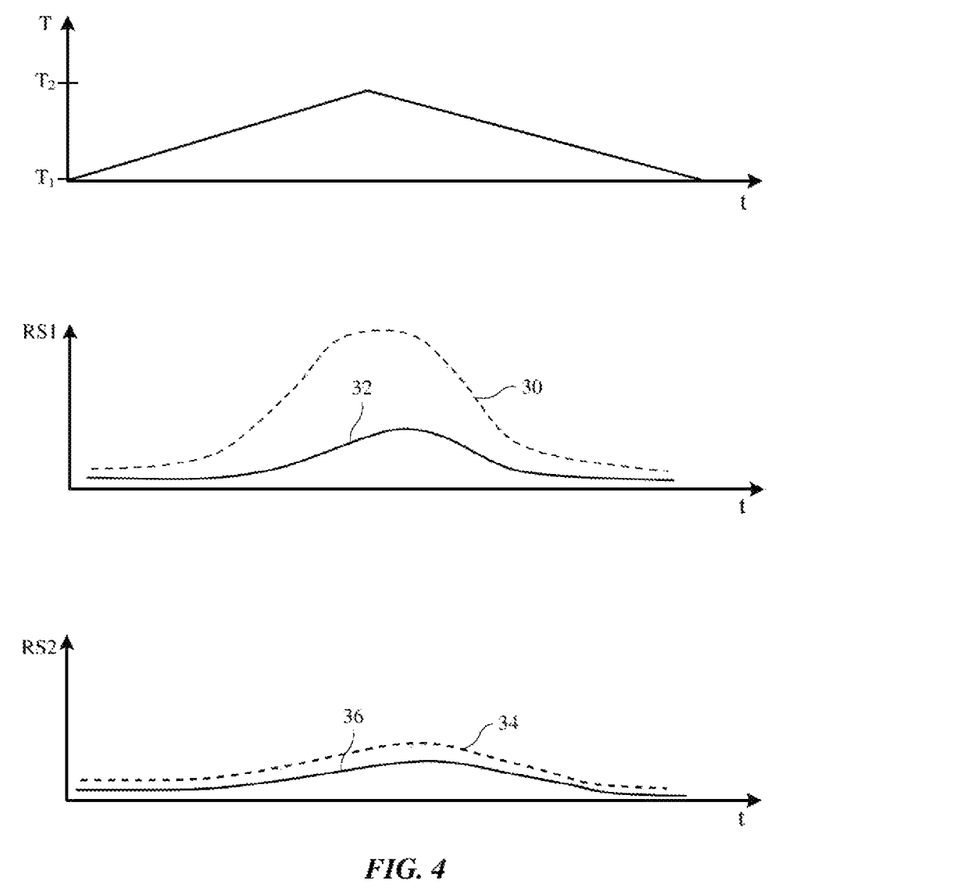
FIG. 4 is a graph showing signals involved in making resistive sensor measurements in an electronic device in accordance with an embodiment.

In the upper graph of FIG. 4, the temperature T that is produced by heaters such as heater 20B for a pair of sensors 20 has been plotted as a function of time t. As shown in this graph, temperature T may start at ambient temperature T1 and may be elevated to temperature T2 before being reduced again to temperature T1. The middle graph of FIG. 4 shows the response (measured resistance RS1) of a first sensor in the pair as a function of time t and the lower graph of FIG. 4 shows the response (measured resistance RS2) of a second sensor in the pair as a function of time t. In the FIG. 4 example, both the first and second sensors have been exposed to first and second gases. Trace 30 represents the response of resistance RS1 for the first sensor when the first sensor is in the presence of the first gas. Trace 32 represents the response of resistance RS1 for the first sensor when the first sensor is in the presence of the second gas. Trace 34 represents the response of resistance RS2 for the second sensor when the second sensor is in the presence of the first gas. Trace 36 represents the response of resistance RS2 for the second sensor when the second sensor is in the presence of the second gas.

With one illustrative scenario, the first sensor may be an ozone sensor and the second sensor may be a carbon diode sensor. The first gas may be air containing a high concentration of ozone and the second gas may be air containing a low concentration of ozone. The $CO_2$ concentration for the first and second air samples may be the same (in this example). As shown in the graphs of FIG. 4, the first sensor (i.e., the ozone sensor) exhibits a significant change in resistivity RS1 when exposed to ozone (and this effect is most pronounced at elevated temperatures). The second sensor (i.e., the carbon dioxide sensor in this example) does not exhibit a significant change in resistivity RS2. Using measurements of the resistances RS1 and RS2, control circuitry 22 of device 10 can determine the chemical composition of ambient air. Resistive sensor measurements may also be made to measure ambient air pressure, temperature, humidity, magnetic field strength, force, acoustic levels, strain, and other physical parameters, etc.

Sensor dynamic range, sensor accuracy, and sensor coverage (e.g., the number of different types of gases that are monitored, the number of orientations in which magnetic field is measured, the number of different types of physical parameters such as temperature, magnetic field, pressure, etc. that are monitored, etc.) may be enhanced by using an array of resistive sensors. The array may be a rectangular array having rows and columns of resistive sensors. There may, in general, be any suitable number of rows and columns of sensors in the sensor array (e.g., two or more rows and two or more columns, three or more rows and three or more columns, four or more rows and/or columns, five to ten rows and/or columns, fewer than 20 rows and/or columns, etc.).

Figure 5:
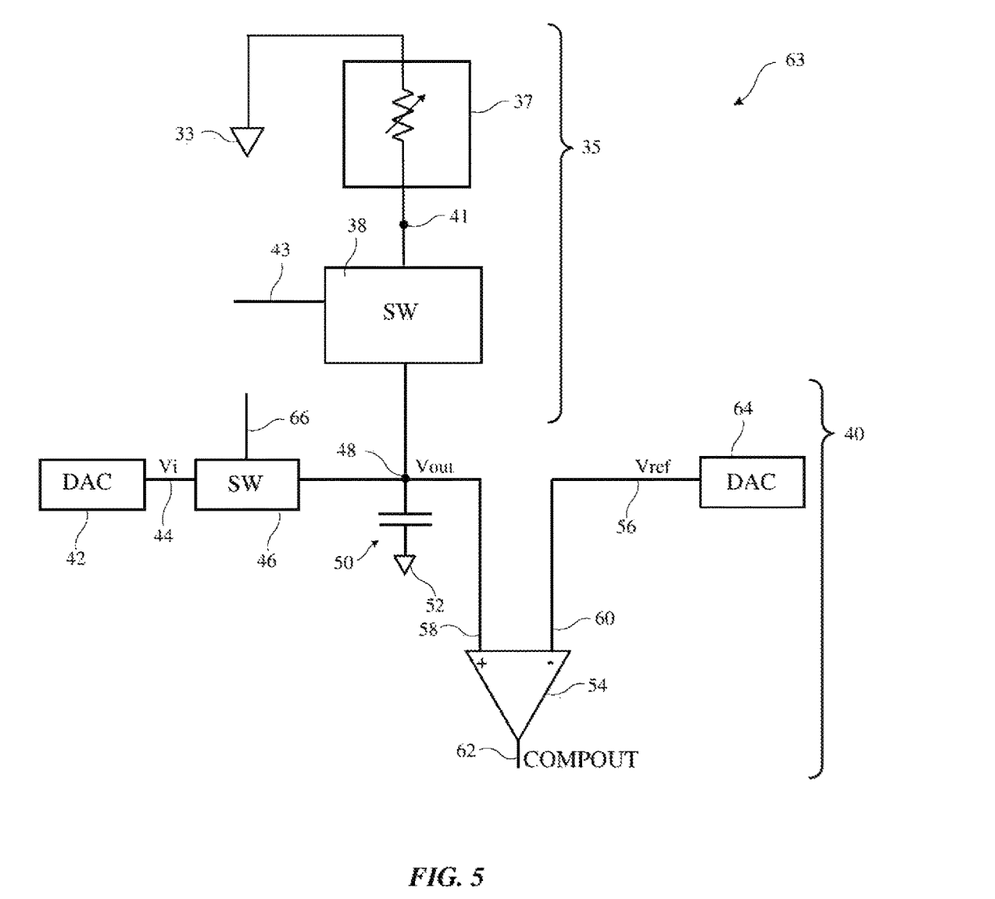
FIG. 5 is a circuit diagram of circuitry for processing resistive sensor measurements in accordance with an embodiment.

An illustrative circuit of the type that may be used to process resistive sensor measurements for resistive sensors in an array is shown in FIG. 5. Circuitry 63 of FIG. 5 may include resistive sensor circuit 30 and readout circuitry 40. Resistive sensor circuit 35 may include a resistive sensor such as resistive sensor 37. Sensor 37 may have a first terminal coupled to ground 33 and a second terminal coupled to node 41. During operation, the resistance of resistive sensor 37 between the first and second terminals may vary, as described in connection with FIGS. 3 and 4. Resistive sensor circuit 35 may also include switching circuitry such as switch 38. Switch 38 may have a control input that receives a control signal from control circuitry in device 10 via line 43.

Readout circuitry 40 may be used to measure the resistance of resistive sensor 37. With the illustrative configuration of FIG. 5, circuitry 40 produces a logic signal COMPOUT having a duration that is responsive to the size of the resistance of resistive sensor 37.

Circuitry 40 may include digital-to-analog converter 42 and digital-to-analog-converter 64. Converter 42 may produce a known initialization voltage Vi on line 44. Switch 46 may have a control input that receives a control signal from control circuitry in device 10 via line 66. Capacitor 50 may have a first terminal coupled to node 48 and a second terminal coupled to ground 52. When it is desired to establish a known initialization voltage Vi on node 48 and thereby load voltage Vi onto capacitor 50, switch 46 may be closed. Switch 46 may then be opened to allow capacitor 50 to discharge through sensor 32 during resistance measurement operations.

During resistance measurement operations, digital-to-analog converter 64 may place a known reference voltage Vref on line 56. Comparator 54 has two inputs. Input 60 may be coupled to line 56 and may receive reference voltage Vref. Input 58 may be coupled to node 48 and may receive a voltage Vout from node 48. Comparator 54 compares the voltages on inputs 60 and 58 and produces a corresponding output signal (i.e., signal COMPOUT) on output 62 (i.e., a digital signal pulse). The duration of the COMPOUT pulse is reflective of the rate at which capacitor 50 discharges through resistive sensor 37 and can therefore be processed to determine the resistance (sensor reading) from resistive sensor 37.

Figure 6:
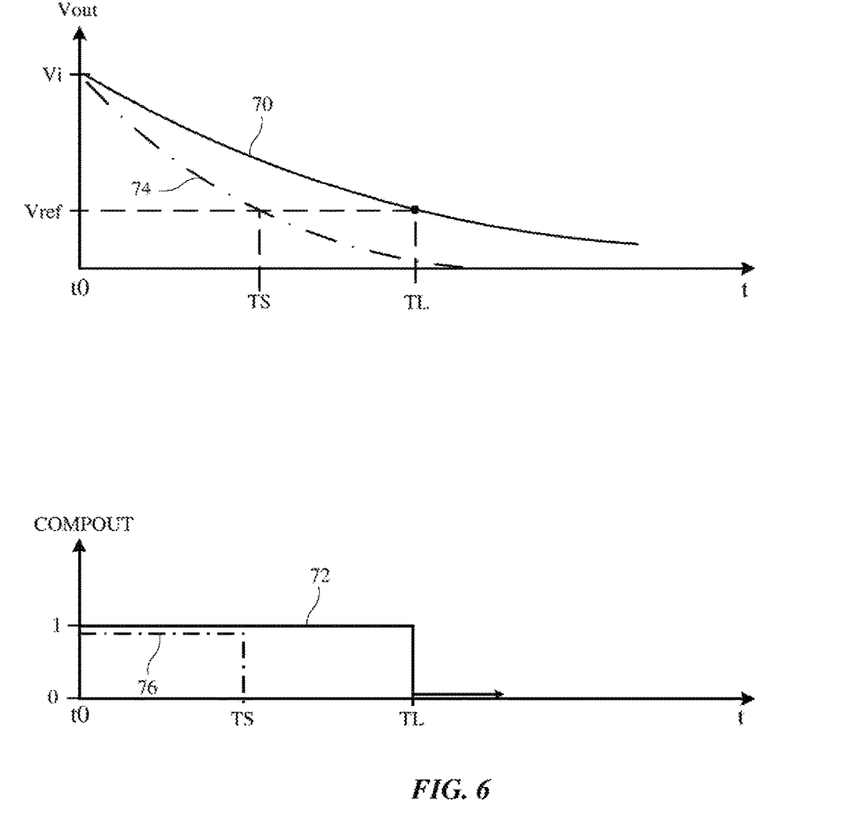
FIG. 6 is a graph showing signals involved in processing resistive sensor measurements using circuitry of the type shown in FIG. 5 in accordance with an embodiment.

FIG. 6 is a graph illustrating the operation of circuitry 64 when processing resistive sensor measurements from resistive sensor 37.

At time t0, switch 38 is opened to isolate node 48 from resistive sensor 37. Switch 46 is closed to load known initialization voltage Vi onto node 48 and capacitor 50. Accordingly, the voltage Vout on node 48 is equal to Vi at time t0. Comparator 54 compares the value of Vout to Vref and produces comparator output COMPOUT. Reference voltage Vref is less than initialization voltage Vi, so COMPOUT is high (i.e., a logic one) at time t0.

After loading Vi onto node 48, switch 46 is opened and switch 38 is closed. This allows the voltage Vout on capacitor 50 to discharge to ground 33 through switch 38 and resistive sensor 37. When Vout drops below Vref, the output COMPOUT of comparator 54 will toggle (i.e., COMPOUT will change to a logic zero).

Two scenarios are illustrated in the graphs of FIG. 6. In the first scenario, the resistance of resistive sensor 37 is relatively high. In the second scenario, the resistance of resistive sensor 37 is relatively low.

In the high resistance scenario, capacitor 50 discharges relatively slowly. Voltage Vout starts at Vi (at time t0) and decays to below Vref at time TL, as indicated by trace 70 in the upper graph of FIG. 6. As shown by trace 72 in the lower graph of FIG. 6, comparator 54 detects that Vout has fallen below Vref at time TL and takes COMPOUT low at time TL.

In the low resistance scenario, the resistance of resistive sensor 37 is relatively low. As a result, capacitor 50 discharges more rapidly through sensor 37, as indicated by trace 74 in the upper graph of FIG. 6. At a time TS that is less than time TL, voltage Vout drops below Vref. Comparator 54 therefore takes COMPOUT low at time TS, as indicated by trace 76 in the lower graph of FIG. 6. Because the duration (time TL in the higher resistance scenario and time TS in the lower resistance scenario) of the COMPOUT signal following closure of switch 38 (i.e., the duration of COMPOUT while discharging capacitor 50) is governed by the resistance of resistive sensor 37, COMPOUT may be processed by the control circuitry of device 10 to produce a digital signal indicative of the sensor reading of sensor 37.

Figure 7:
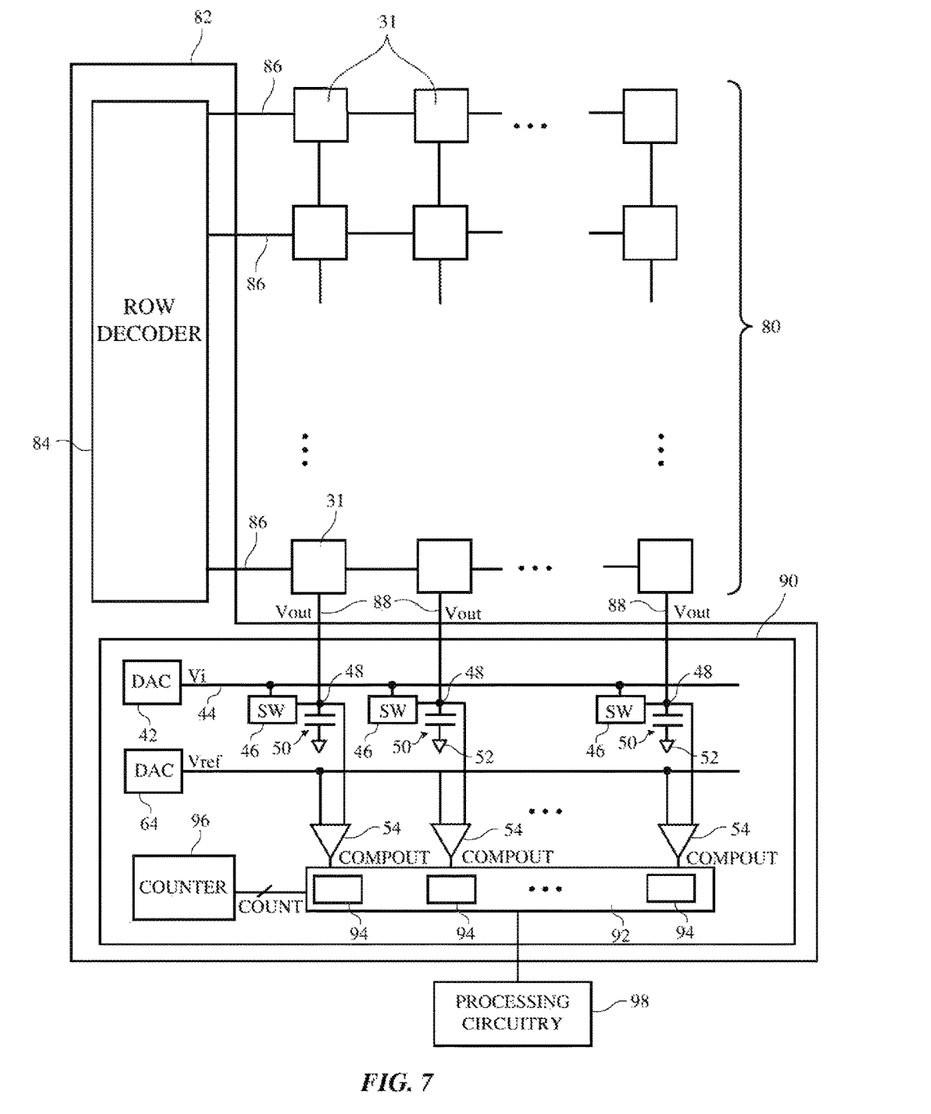
FIG. 7 is a circuit diagram of circuitry for processing sensor measurements from an array of resistive sensors in accordance with an embodiment.

As shown in FIG. 7, device 10 may be provided with an array of resistive sensor circuits 31. Resistive sensor array 80 may contain any suitable number of circuits 31 (e.g., two or more, four or more, eight or more, 16 or more, 2-20, 4-25, 4-36, fewer than 20, more than 40, etc.). Array 80 may have an equal number of rows and columns, may have unequal numbers of row and columns (i.e., array 80 may be rectangular), or may have other suitable shapes and sizes. Each resistive sensor circuit 31 may have a resistive sensor and associated switch, as shown by resistive sensor 37 and switch 38 of FIG. 5.

Control circuitry 22 (FIG. 2) may be used to gather sensor measurements from sensor array 80, may be used to process the sensor measurements, and may be used to take suitable actions based on the sensor measurements. As shown in FIG. 7, for example, control circuitry 22 may include resistive sensor array control circuitry 82 that is coupled to array 80 and that supplies array 80 with control signals while gathering sensor data from sensors 37 in array 80. Resistive sensor array control circuitry 82 may include row decoder circuitry 84 or other circuitry that supplies control signals on row lines 86 to rows of switches 38 in associated rows of sensor circuits 31 of array 80. Row decoder circuitry 84 may assert a control signal on each row line 86 in sequence while deasserting control signals on all other row lines 86 in array 80. In this way, row decoder circuitry 84 may activate the switches 38 in array 80 in a row-by-row fashion. If desired, other sensor array readout patterns may be used (e.g., non-sequential row access patterns).

As each row of circuits 31 in array 80 is selected, column readout circuitry 90 may be used to sense the resistances of each of the resistive sensors in the selected row. Column readout circuitry 90 may include digital-to-analog converter circuitry 42 for producing initialization voltage Vi and may include digital-to-analog converter circuitry 64 for producing reference voltage Vref. A row of switches 46 in circuitry 90 may be used to supply initialization voltage Vi to nodes 48. Each of nodes 48 may be coupled to one of the terminals of a respective capacitor in a row of capacitors 50, as described in connection with switch 46 and capacitor 50 of FIG. 5. There may be a capacitor 50 associated with each column of array 80. Each node 48 and therefore each capacitor 50 may be coupled to a respective column line 88. Each column line 88 may be coupled to each of the switches 38 of the sensor circuits 31 of a respective column of array 80. By turning on the switches 38 of a selected row, the resistive sensors 37 of that row may be coupled to the associated row of capacitors 50. This allows voltages Vout on capacitors 50 to discharge in parallel through the resistive sensors 37 of the selected row.

Column readout circuitry 90 may include a row of comparators 54, each of which is associated with a respective column of resistive sensor circuits 31. Comparators 54 may supply output signals COMPOUT to memory and processing circuit 92. Circuitry 92 may have a row of memory cells 94, each of which is associated with a respective column of array 80. Circuitry 92 may receive a counter output signal (sometimes referred to as a count value or count) such as signal COUNT from counter 96. The value of COUNT when COMPOUT toggles in a given column (e.g., when COMPOUT falls from high to low at a time such as time TS or TL in the examples of FIG. 6) may be stored in the memory cell 94 for that column. In this way, a digital value (e.g., a 12 bit count value or other suitable digital count value) that represents the resistance of each resistive sensor 37 in the currently selected row may be gathered by circuit 92. These resistance values may then be read out of circuit 92 using processing circuitry 98 and suitable action taken (e.g., processing circuitry 98 may display the resistive sensor data from sensors 32, may issue alerts when sensor data passes predetermined threshold values, may provide applications running on control circuitry 22 with sensor information so that a user of device 10 can be informed about current ambient air conditions, magnetic readings, air pressure information, and/or other resistive sensor data.

If desired, circuits 31 of array 80 and circuitry 82 (and, if desired, circuitry 98) may be implemented on a common semiconductor substrate (e.g., a common silicon die). Configurations in which multiple semiconductor substrates are used in implementing array 80 and/or circuitry 82 and 98 may also be used. Sensor array 80 may include multiple sensors of the same type that have different sensitivities and/or ranges of operation (e.g., so that multiple sensor readings taken together can more effectively cover a desired range of potential sensor data values). and/or may include sensors of different types (e.g., to cover multiple different types of measured physical parameters such as temperature, pressure, gas concentration, strain, magnetic field, etc.). The array architecture of FIG. 7 supports parallel data readout operations, because in an array with N columns, circuitry 90 can simultaneously gather N different resistive sensor measurements from the currently selected row. Circuit resources may be conserved, because it is not necessary to provide each sensor 37 with a dedicated readout circuit. For example, in an array with M rows, each of the M rows can share a common readout circuit (circuitry 90).

Figure 8:
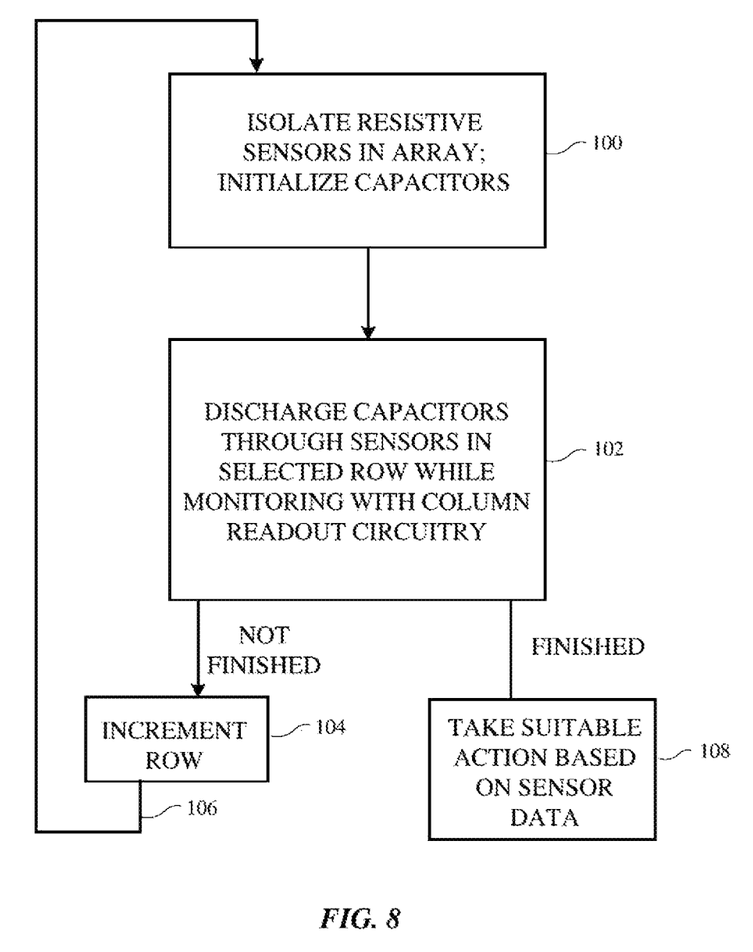
FIG. 8 is a flow chart of illustrative operations involved in gathering resistive sensor data from an array of resistive sensors and taking suitable action in an electronic device in accordance with an embodiment.

A flow chart of illustrative operations involved in gathering resistive sensor data from an array of resistive sensors and taking suitable action in electronic device 10 is shown in FIG. 8.

At step 100, row decoder 84 may open switches 38 in array 80 to isolate resistive sensors 37 from column lines 88 and capacitors 50. Circuitry 82 may also issue control signals for switches 46 that momentarily close switches 46 and supply initialization voltage Vi from output line 44 of digital-to-analog converter 42 to node 48 and capacitors 50, thereby initializing capacitors 50 at voltage Vi.

At step 102, row decoder 84 may close the switches 38 in a selected row of array 80, thereby discharging capacitors 50 through the resistive sensors 37 in that row. Column readout circuitry 90 may monitor the discharge of capacitors 50 and may store count values from counter 96 in memory cells 94 of circuit 92 in response to toggling output signals from comparators 54, thereby converting discharge time information (which relates to sensor resistance) into digital sensor readings. If additional resistance values from resistive sensors 37 are to be gathered (e.g., values from additional rows), the row to be monitored may be updated at step 104 and processing may loop back to step 100, as shown by line 106. If sufficient resistive sensor data has been gathered, suitable action may be taken at step 108 (e.g., information on sensor readings may be presented to a user on display 14, an alert may be presented to a user, or other action may be taken using control circuitry 22).

The foregoing is merely illustrative and various modifications can be made by those skilled in the art without departing from the scope and spirit of the described embodiments. The foregoing embodiments may be implemented individually or in any combination.

What is claimed is:

1. Resistive sensor circuitry, comprising:
   an array of resistive sensors having rows and columns, wherein the array of resistive sensors are configured to make ambient air measurements; and
   resistive sensor array control circuitry including row decoder circuitry that is configured to select a row of the array and column readout circuitry that gathers resistive sensor measurements from each of the resistive sensors in the selected row, wherein the column readout circuitry further comprises:

memory cells, each of which is coupled to a respective column of resistive sensors in the array; and a counter that provides the memory cells with a count value.

2. The resistive sensor circuitry defined in claim 1 wherein the column readout circuitry includes capacitors and wherein each of the capacitors discharges through a respective one of the resistive sensors in the selected row.

3. The resistive sensor circuitry defined in claim 2 wherein the column readout circuitry includes comparators.

4. The resistive sensor circuitry defined in claim 3 wherein each column of the array has an associated column line and wherein each of the capacitors discharges through a respective one of the resistive sensors in the selected row through a respective one of the column lines.

5. The resistive sensor circuitry defined in claim 1, wherein each of the memory cells receives a comparator output signal from a respective one of the comparators and is configured to store the count value when that comparator output signal toggles.

6. The resistive sensor circuitry defined in claim 5 wherein the column readout circuitry further comprises:
a first digital-to-analog converter that produces an initialization voltage; and
a second digital-to-analog converter that produces a reference voltage for the comparators, wherein each of the resistive sensors comprises a resistive sensor selected from the group consisting of: a pressure sensor, a gas sensor, a magnetic sensor, a force sensor, an acoustic sensor, a temperature sensor, a humidity sensor, and a particulate sensor.

7. The resistive sensor circuitry defined in claim 6 further comprising:
first switching circuitry coupled between the resistive sensors and the column lines, wherein the capacitors discharge through the resistive sensors in the selected row by discharging through the column lines, the first switching circuitry, and the resistive sensors; and
second switching circuitry coupled between the first digital-to-analog converter circuitry and the capacitors that is configured to supply the capacitors with the initialization voltage before the capacitors are discharged through the resistive sensors.

8. Circuitry, comprising:
an array of resistive sensors having rows and columns, wherein each row includes a row line and wherein each column includes a column line, wherein each resistive sensor in the array is coupled to a respective column line via a corresponding first switch;
a row decoder configured to control the first switch associated with each resistive sensor in the array;
capacitors, wherein each capacitor is coupled to a respective one of the column lines at a node; and
second switches each of which is coupled to a respective one of the nodes.

9. The circuitry defined in claim 8 wherein each of the resistive sensors comprises a resistive sensor selected from the group consisting of: a pressure sensor, a gas sensor, a magnetic sensor, a force sensor, an acoustic sensor, a temperature sensor, a humidity sensor, and a particulate sensor.

10. The circuitry defined in claim 8 further comprising comparators, each comparator having a first input coupled to a respective one of the nodes, having a second input that receives a reference voltage, and having an output.

11. The circuitry defined in claim 10 wherein each of the second switches is configured to supply an initialization voltage to the node coupled to that second switch when that second switch is closed.

12. The circuitry defined in claim 11 further comprising row decoder circuitry that supplies control signals to the first switches through the row lines.

13. The circuitry defined in claim 12 wherein the row decoder circuitry is configured to turn on the first switches in a selected one of the rows so that the capacitors discharge through the resistive sensors in the selected one of the rows.

14. The circuitry defined in claim 13 further comprising:
a counter; and
memory and processing circuitry that stores count values from the counter in the memory and processing circuitry in response to signals from the outputs of the comparators.

15. Resistive sensor circuitry, comprising:
an array of resistive sensor circuits having rows and columns, wherein each resistive sensor circuit has a switch and a resistive sensor having a first terminal coupled to the switch and a second terminal directly connected to a ground line;
capacitors each of which is associated with one of the columns; and
row decoder circuitry that selectively turns on the switches in a selected one of the rows and thereby discharges the capacitor in each column through the resistive sensor that is in the selected row and that is in that column.

16. The resistive sensor circuitry defined in claim 15 wherein each of the resistive sensors comprises a resistive sensor selected from the group consisting of: a pressure sensor, a gas sensor, a magnetic sensor, a force sensor, an acoustic sensor, a temperature sensor, a humidity sensor, a particulate sensor, and a light sensor.

17. The resistive sensor circuitry defined in claim 16 further comprising at least one heater that heats at least one of the resistive sensors.

18. The resistive sensor circuitry defined in claim 16 further comprising comparators each of which has a first input coupled to a respective one of the capacitors and each of which has a second input that receives a reference voltage.

19. The resistive sensor circuitry defined in claim 18 further comprising a circuit that receives count values from a counter and that stores the count values in response to signals from the comparators.

* * * * *